(12) United States Patent
Wu et al.

(10) Patent No.: US 12,107,574 B2
(45) Date of Patent: Oct. 1, 2024

(54) SWITCH CONTROL MODULE

(71) Applicant: LITE-ON TECHNOLOGY CORPORATION, Taipei (TW)

(72) Inventors: Po-Lin Wu, Taipei (TW); Han-Min Lee, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 18/097,904

(22) Filed: Jan. 17, 2023

(65) Prior Publication Data

US 2023/0261655 A1 Aug. 17, 2023

(30) Foreign Application Priority Data

Feb. 16, 2022 (TW) .................................. 111105633

(51) Int. Cl.
*H03K 17/00* (2006.01)
*H03K 17/687* (2006.01)
*H03K 17/689* (2006.01)

(52) U.S. Cl.
CPC ......... *H03K 17/689* (2013.01); *H03K 17/687* (2013.01)

(58) Field of Classification Search
CPC ........................... H03K 17/689; H03K 17/687
See application file for complete search history.

(56) References Cited

U.S. PATENT DOCUMENTS

| | | | | |
|---|---|---|---|---|
| 3,942,083 A | * | 3/1976 | Takahashi | H02P 6/20 318/400.3 |
| 4,455,585 A | * | 6/1984 | Murari | H02H 7/067 361/111 |
| 4,805,322 A | * | 2/1989 | Lemire | E02F 5/30 37/417 |
| 4,916,378 A | * | 4/1990 | Marchio' | H03K 17/08146 323/222 |
| 5,894,395 A | * | 4/1999 | Baurand | H02H 9/047 361/93.6 |
| 5,984,395 A | * | 11/1999 | Halpen | A63B 55/10 206/315.6 |
| 6,040,969 A | | 3/2000 | Winch et al. | |
| 6,115,230 A | | 9/2000 | Voigts et al. | |
| 6,639,444 B2 | * | 10/2003 | Ikeda | H03K 17/08142 327/326 |
| 7,961,443 B2 | * | 6/2011 | Pfingsten | H01H 50/021 361/14 |
| 8,004,810 B2 | * | 8/2011 | Shuey | H02H 1/0007 361/111 |
| 10,637,469 B2 | * | 4/2020 | Wilson | H03K 17/0822 |
| 2005/0012505 A1 | * | 1/2005 | Wilson | G01R 31/3278 324/418 |
| 2010/0213184 A1 | * | 8/2010 | Harris | F24C 7/088 219/385 |

FOREIGN PATENT DOCUMENTS

WO WO-2010088178 A1 * 8/2010 ....... H03K 17/08142

* cited by examiner

*Primary Examiner* — Tuan T Lam
(74) *Attorney, Agent, or Firm* — Innovation Counsel LLP

(57) ABSTRACT

A switch control module including a master switch, a clamping element and a diode is provided. The master switch is configured to receive a control signal having a conducting interval and a non-conducting interval. The diode couples the clamping element and the master switch.

17 Claims, 4 Drawing Sheets

SWITCH CONTROL MODULE

This application claims the benefit of Taiwan application Serial No. 111105633, filed Feb. 16, 2022, the subject matter of which is incorporated herein by reference.

BACKGROUND OF THE INVENTION

Field of the Invention

The invention relates in general to a switch control module.

Description of the Related Art

Conventional electronic equipment requires an input of power source to maintain normal operations of an electronic device. However, when the input power source malfunctions, the malfunctioned power source may damage the electronic equipment. Therefore, it has become a prominent task for the industries to provide a module capable of protecting the electronic device.

SUMMARY OF THE INVENTION

The present invention provides a switch control module capable of resolving the above problems.

According to one embodiment of the present invention, a switch control module including a master switch, a clamping element and a diode is provided. The master switch is configured to receive a control signal having a conducting interval and a non-conducting interval. The diode couples the clamping element and the master switch.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
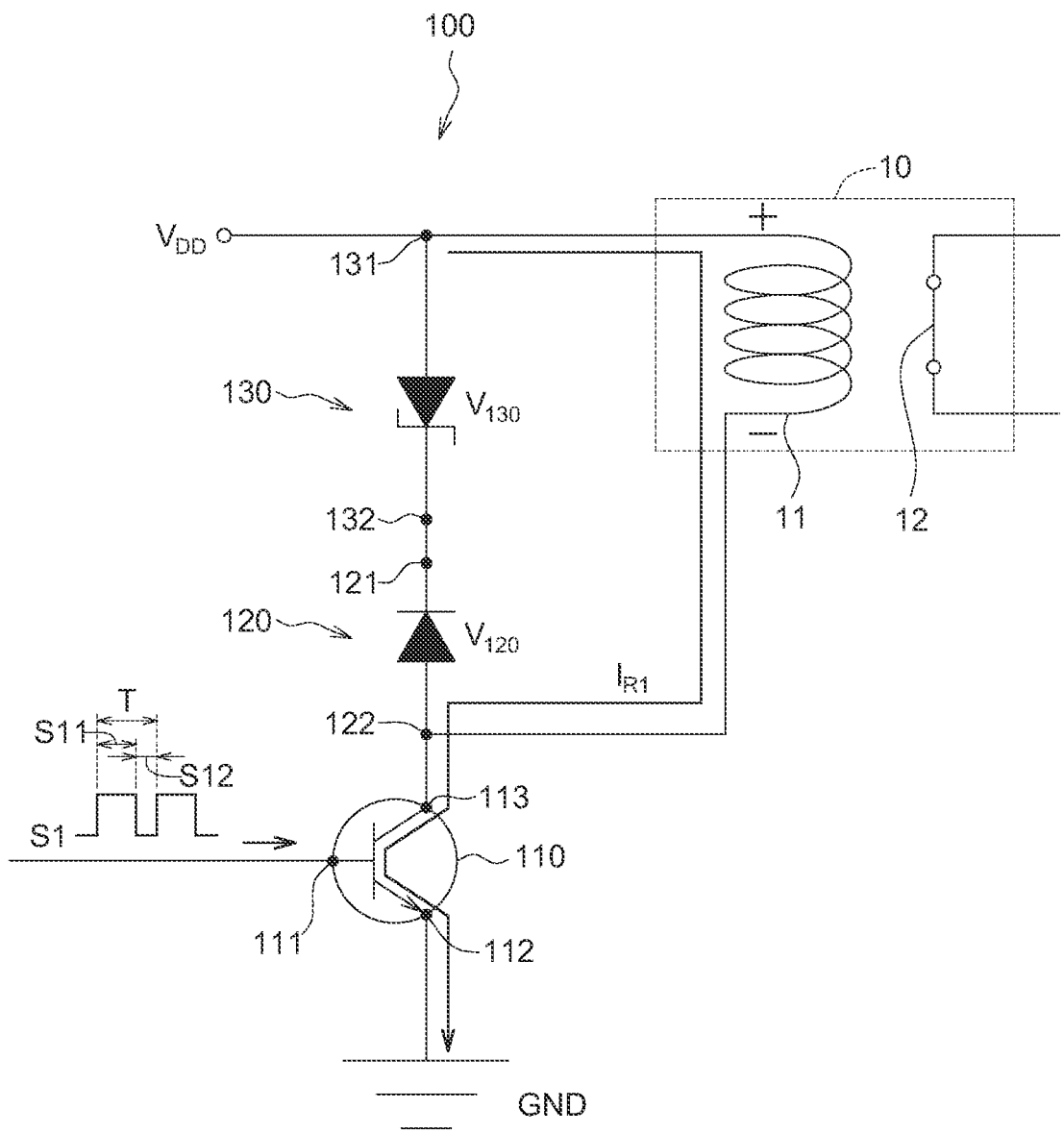
FIG. 1 is a schematic diagram of a switch control module according to an embodiment of the present invention.
Figure 2:
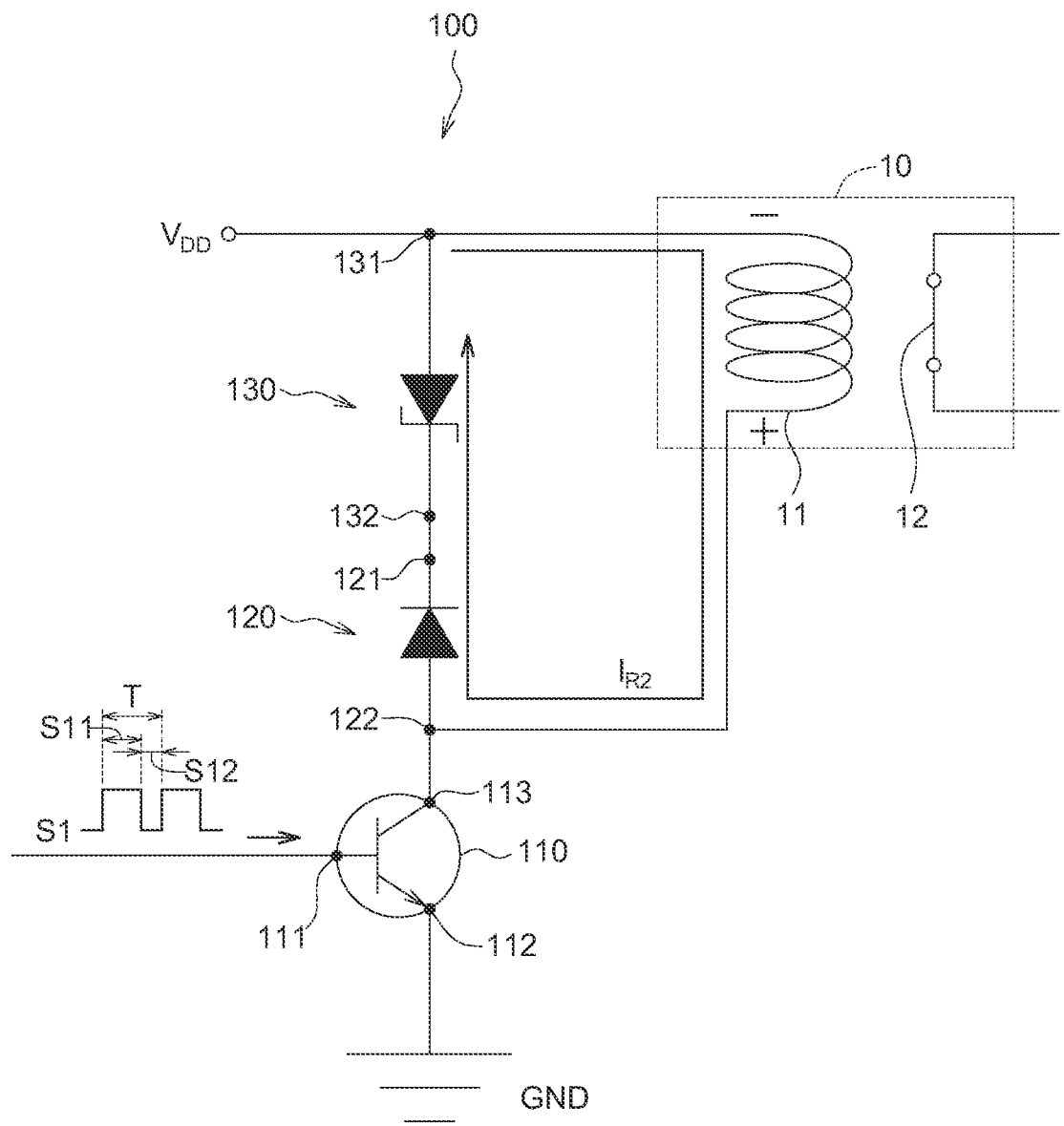
FIG. 2 is a circuit diagram of a non-conducting interval of a control signal inputted to the master switch of FIG. 1.
Figure 3:
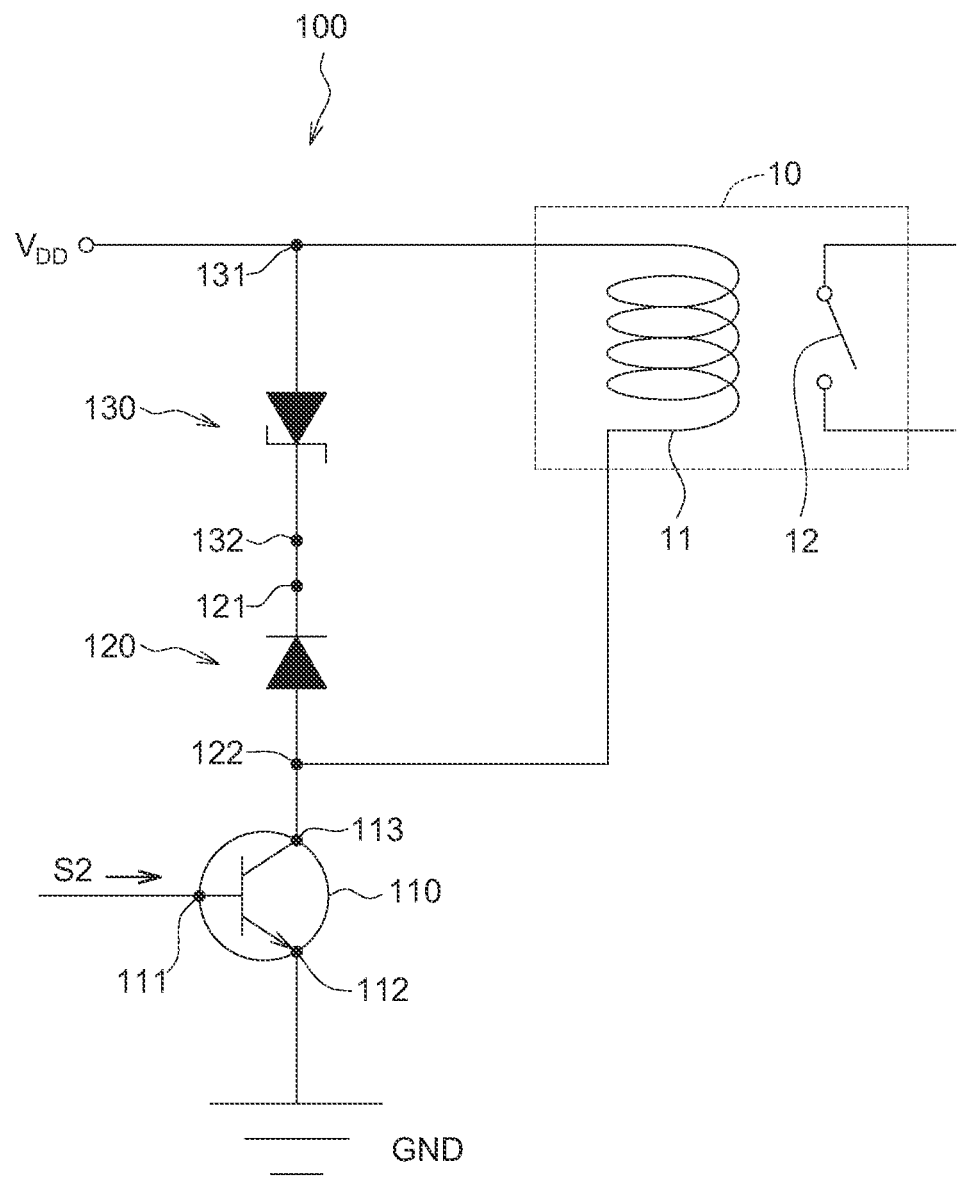
FIG. 3 is a circuit diagram of a control signal inputted to the master switch of FIG. 1.

Refer to FIGS. 1 to 3. FIG. 1 is a schematic diagram of a switch control module 100 according to an embodiment of the present invention. FIG. 2 is a circuit diagram of a non-conducting interval S12 of a control signal S1 inputted to the master switch 110 of FIG. 1. FIG. 3 is a circuit diagram of a breaking signal S2 inputted to the master switch 110 of FIG. 1.

The switch control module 100 can be used in a charger of an electronic device, such as a transportation vehicle (for instance, an electric car). When the input power source malfunctions, the switch control module 100 can cut out the input of power source to protect the circuits inside the electronic device and/or the charger.

As indicated in FIG. 1, the switch control module 100 is configured to control a slave switch 10. The switch control module 100 includes a master switch 110, a diode 120 and a clamping element 130. The master switch 110 is configured to receive a control signal S1 having a conducting interval S11 and a non-conducting interval S12. The diode 120 couples the clamping element 130 and the master switch 110. Through the use of the clamping element 130, the required time for shifting the slave switch 10 from a conducting state to a non-conducting state can be reduced. Furthermore, since the control signal S1 is a non-continuous conducting signal, the power consumption of the slave switch 10 can be reduced.

As indicated in FIG. 1, the slave switch 10 can be realized by a relay, which includes an inductor 11 and a switch 12. When the magnetic force generated from the energy stored in the inductor 11 is greater than elastic force for disconnecting the switch 12, the switch 12 is conducted, the power source can be transmitted to the circuit at the next stage (back end), such as the circuits inside the electronic device and/or the charger, through the slave switch 10. When the inductor 11 releases energy, the magnetic force decreases. When the magnetic force is less than the elastic force for disconnecting the switch 12, the switch 12 is disconnected to cut out the input of the power source to protect the circuits at the next stage (back end).

As indicated in FIG. 1, the control signal S1 can be a pulse-width modulation (PWM) signal, which is a cyclic signal. Each cycle T of the control signal S1 includes a conducting interval S11 and a non-conducting interval S12, wherein the conducting interval S11 is a time interval for conducting the master switch 110, and the non-conducting interval S12 is a time interval for disconnecting the master switch 110. A ratio of the conducting interval S11 to the cycle T is defined as a duty cycle. The conducting interval S11 can be a high-level signal; the non-conducting interval S12 can be a low-level signal having a voltage of 0 V for instance.

As indicated in FIG. 1, when the conducting interval S11 of the control signal S1 is inputted to the master switch 110, the master switch 110 is conducted, and the drive current $I_{R1}$ of the driving voltage $V_{DD}$ flows to low potential GND (such as the ground potential) through the inductor 11 and the master switch 110, wherein the drive current $I_{R1}$ is defined as a forward current (one end of the inductor 11 coupled to the driving voltage $V_{DD}$ is an anode; the other end of the inductor 11 coupled to the master switch 110 is a cathode). In an embodiment, the master switch 110 can be realized by a metal-oxide-semiconductor field-effect transistor (MOSFET), but the embodiments of the present invention are not limited thereto.

As indicated in FIG. 2, when the non-conducting interval S12 of the control signal S1 is inputted to the master switch 110, the master switch 110 is disconnected, the inductor 11 releases energy, and the inductor current $I_{R2}$ of the inductor 11 flows through a loop formed by the inductor 11, the diode 120 and the clamping element 130, wherein the inductor current $I_{R2}$ is defined as a reverse current (one end of the inductor 11 coupled to the driving voltage $V_{DD}$ is a cathode; the other end of the inductor 11 coupled to the master switch 110 is an anode). Within the non-conducting interval S12 of the control signal S1, the inductor 11 releases energy and therefore causes the magnetic force of the inductor 11 to reduce. However, before the magnetic force of the inductor 11 decreases to be less than the elastic force for disconnecting the switch 12, the conducting interval S11 of the next cycle of the control signal S1 is already inputted to the master switch 110 for conducting the master switch 110 again, so that the drive current $I_{R1}$ of the driving voltage $V_{DD}$ stores energy to the inductor 11 again, the magnetic force of the inductor 11 again increases, and the switch 12 will not be disconnected (that is, within the non-conducting interval S12 of the control signal S1, the slave switch 10 still remains conducted).

As indicated in FIG. 3, the breaking signal S2 continues to be a low-level signal. When the breaking signal S2 is inputted to the master switch 110, the master switch 110 is disconnected, the inductor 11 releases energy, and the inductor current $I_{R2}$ of the inductor 11 flows through the loop formed by the inductor 11, the diode 120 and the clamping element 130 and gradually decreases. When the inductor current $I_{R2}$ decreases to be less than the elastic force of the switch 12, the switch 12 is disconnected to cut out the input of the power source to protect the circuits at the next stage.

To summarize, due to the characteristics of the PWM signal, the power consumption of the slave switch 10 can be reduced and the technical efficacy of saving power source can be achieved. Moreover, as long as a suitable volume of drive current $I_{R1}$ is provided, the switch 11 still can remain conducted within the non-conducting interval S12 of the control signal S1. Only when an abnormal state is detected will the breaking signal S2 be inputted to the master switch 110 to cut out the input of the power source.

The method for obtaining the drive current $I_{R1}$ is disclosed below.

Refer to formulae (1) to (2), where $V_{120}$ represents a forward bias of the diode 120, $V_{130}$ represents a reverse bias of the clamping element 130, $I_{R1}$ represents a drive current, $V_{DD}$ represents a driving voltage, D represents a duty cycle of the control signal S1, and $Z_{130}$ represents an impedance of the clamping element 130. In an embodiment, let the forward bias $V_{120}$ be 0.7 voltage (V), the reverse bias $V_{130}$ be 6 V, the driving voltage $V_{DD}$ be 12 V, the duty cycle D be 0.6604 (that is, 66.04%), and $Z_{130}$ be 120 ohms (Ω). After substituting these exemplifications into formulae (1) to (2), the drive current $I_{R1}$ is 47.08 milliamperes (mA). This current value is a safe current value, which assures that within the non-conducting interval S12, the magnetic force of the inductor 11 is greater than the elastic force for disconnecting the switch 12. Actual value of the safe current value is not specified in the embodiments of the present invention, and is determined according to the specifications and/or design of the elements actually used.

$$V_R = V_{120} + V_{130} \quad (1)$$

$$I_{R1} = \{(V_{DD} \cdot D) - [V_R \cdot (1-D)]\}/Z_{130} \quad (2)$$

Actual values of the forward bias $V_{120}$, the reverse bias $V_{130}$, the drive current $I_{R1}$, the driving voltage $V_{DD}$, the duty cycle D and the impedance $Z_{130}$ exemplified above are determined according to the specifications and/or design of the elements actually used and are not subjected to specific restrictions in the embodiments of the present invention.

Figure 4:
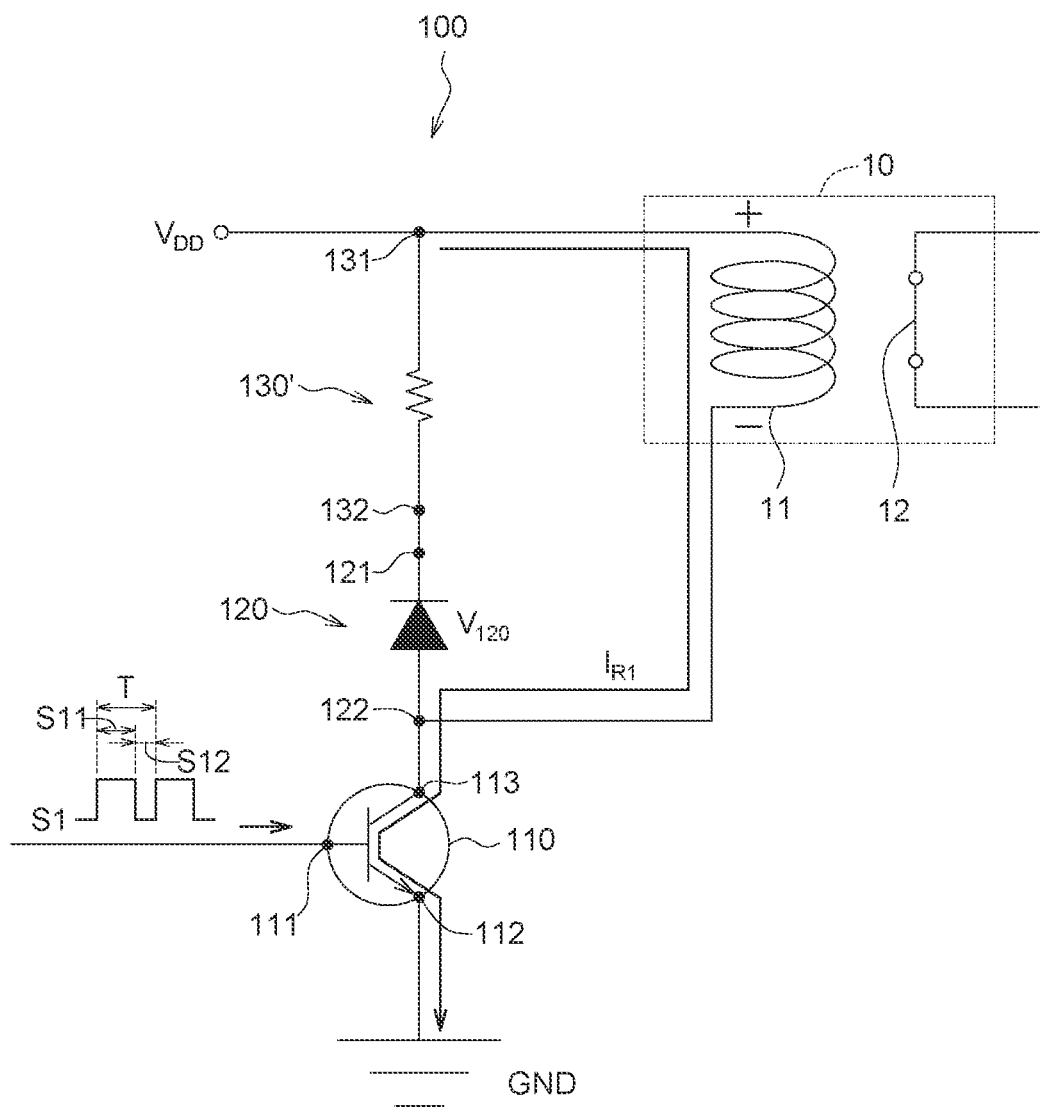
FIG. 4 is a circuit diagram of a switch control module according to another embodiment of the present invention.

In terms of the types of elements, the clamping element 130 can be a Zener diode, and the diode 120 can be a flywheel diode. Through the combination of the Zener diode and the flywheel diode, the cross-voltage VR of the clamping element 130 and the diode 120 (equivalent to the cross-voltage of the inductor 11) can be increased when the non-conducting interval S12 is inputted to the master switch 110, not only reducing average the power consumption of the slave switch 10 but also achieving the technical efficacy of reducing the required time for disconnecting the switch 12 using a reverse high potential (the inductor current decreases in a non-linear manner, such as exponential attenuation or similar downward trend). In another embodiment, the clamping element 130 can be replaced with a resistor 130' (as shown in FIG. 4) and still can increase the reverse cross-voltage VR. As long as the reverse cross-voltage VR can be increased, the implementation of the cross-voltage VR is not subjected to specific restrictions in the embodiments of the present invention. In an embodiment, the reverse cross-voltage VR only needs to be equivalent to or greater than 1V. In the previous example, the sum of the forward bias V_120 of the diode 120 and the reverse bias V_130 of the clamping element 130 is equivalent to 6.7V, which is greater than 1V.

According to formulae (1) to (2), when the duty cycle D is equivalent to 50%, the drive current $I_{R1}$ is 22.08 mA, which is too small to keep the switch 12 conducted within the non-conducting interval S12 of the control signal S1. Generally speaking, the smaller the duty cycle, the better the power consumption. Based on this understanding, anyone skilled in the technology field of the invention will not have any motive to increase the duty cycle. Conversely, in the embodiments of the present invention, the duty cycle D is allowed to be greater than 50%, so that the drive current $I_{R1}$ can be increased to make the switch 12 conducted within the non-conducting interval S12 of the control signal S1. As long as the switch 12 can maintain conducted within the non-conducting interval S12 of the control signal S1, actual value of the duty cycle D is not subjected to specific restrictions in the embodiments of the present invention.

In terms of the connection relationship as indicated in FIG. 1, the master switch 110 includes a gate 111, a source 112 and a drain 113; the gate 111 couples the control signal S1, the source 112 couples a low potential GND, and the drain 113 couples the diode 120. The clamping element 130 includes a first terminal 131 and a second terminal 132. The diode 120 includes a third terminal 121 and a fourth terminal 122. The first terminal 131 couples the driving voltage $V_{DD}$, the second terminal 132 couples the third terminal 121, and the fourth terminal 122 couples the drain 113 of the master switch 110. The first terminal 131 and the fourth terminal 122 both are anodes; the second terminal 132 and the third terminal 121 both are cathodes. Besides, two opposite ends of the inductor 11 are crossly connected the clamping element 130 and the diode 120, respectively. For instance, one end of the inductor 11 is coupled to the first terminal 131 of the clamping element 130, the other end of the inductor 11 is coupled to the fourth terminal 122 of the diode 120.

To summarize, according to the embodiments of the present invention, a switch control module is provided. The switch control module is coupled to the slave switch and includes a master switch, a diode and a clamping element. The diode and the clamping element provide a sufficient cross-voltage capable of reducing the required time for disconnecting the slave switch (the inductor current presents linear or nonlinear attenuation), and the master switch receives a control signal. The control signal has a conducting interval and a non-conducting interval (that is, the control signal is a non-continuous conducting signal), and therefore can reduce the power consumption of the slave switch. Besides, the type of the clamping element is not subjected to specific restrictions in the embodiments of the present invention, and any electronic element capable of providing a sufficient cross-voltage can be used as the clamping element of the present application.

While the invention has been described by way of example and in terms of the preferred embodiment(s), it is to be understood that the invention is not limited thereto.

Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. A switch control module configured to control a slave switch, wherein the switch control module comprises:
   a master switch configured to receive a control signal having a conducting interval and a non-conducting interval;
   a clamping element; and
   a diode coupling the clamping element with the master switch;
   wherein the control signal is a periodic signal comprising a plurality of cycles, each cycle comprises the conducting interval and the non-conducting interval, the master switch is turned on when the conducting interval of each cycle of the control signal is inputted to the master switch, and the master switch is turned off when the non-conducting interval of each cycle of the control signal is inputted to the master switch; the slave switch comprises a switch which is turned on when the control signal is inputted to the master switch;
   wherein a positive electrode of the clamping element is connected with the slave switch, and a positive electrode of the diode is connected with the master switch;
   wherein the slave switch further comprises an inductor; when a magnetic force generated from an energy stored in the inductor is greater than an elastic force for disconnecting the switch, the switch is conducted; when the magnetic force is less than the elastic force for disconnecting the switch, the switch is disconnected to cut out the input of a power source.

2. The switch control module according to claim 1, wherein within the non-conducting interval of each cycle of the control signal, a cross-voltage of the inductor is equivalent to or greater than 1 Volt.

3. The switch control module according to claim 1, wherein the sum of a forward bias of the diode and a reverse bias of the clamping element is equivalent to or greater than 1 Volt.

4. The switch control module according to claim 1, wherein the inductor crosses over the diode and the clamping element.

5. The switch control module according to claim 1, wherein the control signal is a pulse-width modulation (PWM) signal.

6. The switch control module according to claim 1, wherein a ratio of the conducting interval to each cycle is greater than 50%.

7. The switch control module according to claim 6, wherein the ratio is equivalent to 66.04%.

8. The switch control module according to claim 1, wherein the master switch comprises a gate, a source and a drain; the gate couples the control signal, the source couples a ground potential, and the drain couples the diode.

9. The switch control module according to claim 1, wherein the clamping element comprises a first terminal and a second terminal; the diode comprises a third terminal and a fourth terminal; the first terminal couples a driving voltage, the second terminal couples the third terminal, and the fourth terminal couples the master switch.

10. The switch control module according to claim 9, wherein the first terminal and the fourth terminal are anodes, and the second terminal and the third terminal are cathodes.

11. The switch control module according to claim 1, wherein the slave switch is a relay.

12. The switch control module according to claim 1, wherein the clamping element is a Zener diode.

13. The switch control module according to claim 1, wherein the clamping element is a resistor.

14. A switch control module configured to control a slave switch, wherein the switch control module comprises:
   receiving a control signal or a breaking signal by a master switch, wherein the master switch and the slave switch are operated based on the control signal or the breaking signal;
   coupling with the master switch by a diode; and
   coupling with the diode by a clamping element;
   wherein the master switch and the slave switch are turned on in a first operating mode, the master switch is turned off and the slave switch is turned on in a second operating mode, and the master switch and the slave switch are turned off in a third operating mode.

15. The switch control module according to claim 14, wherein the master switch and the slave switch are turned on in the first operating mode when a conducting interval of the control signal is inputted to the master switch.

16. The switch control module according to claim 14, wherein the master switch is turned off and the slave switch is turned on in the second operating mode when a non-conducting interval of the control signal is inputted to the master switch.

17. The switch control module according to claim 14, wherein the master switch and the slave switch are turned off in the third operating mode when the breaking signal is inputted to the master switch.

* * * * *